Feb. 27, 1968 R. M. WILLIAMS, JR 3,371,337
HIGH SPEED ANALOG TO BINARY CONVERTER
Filed July 23, 1964
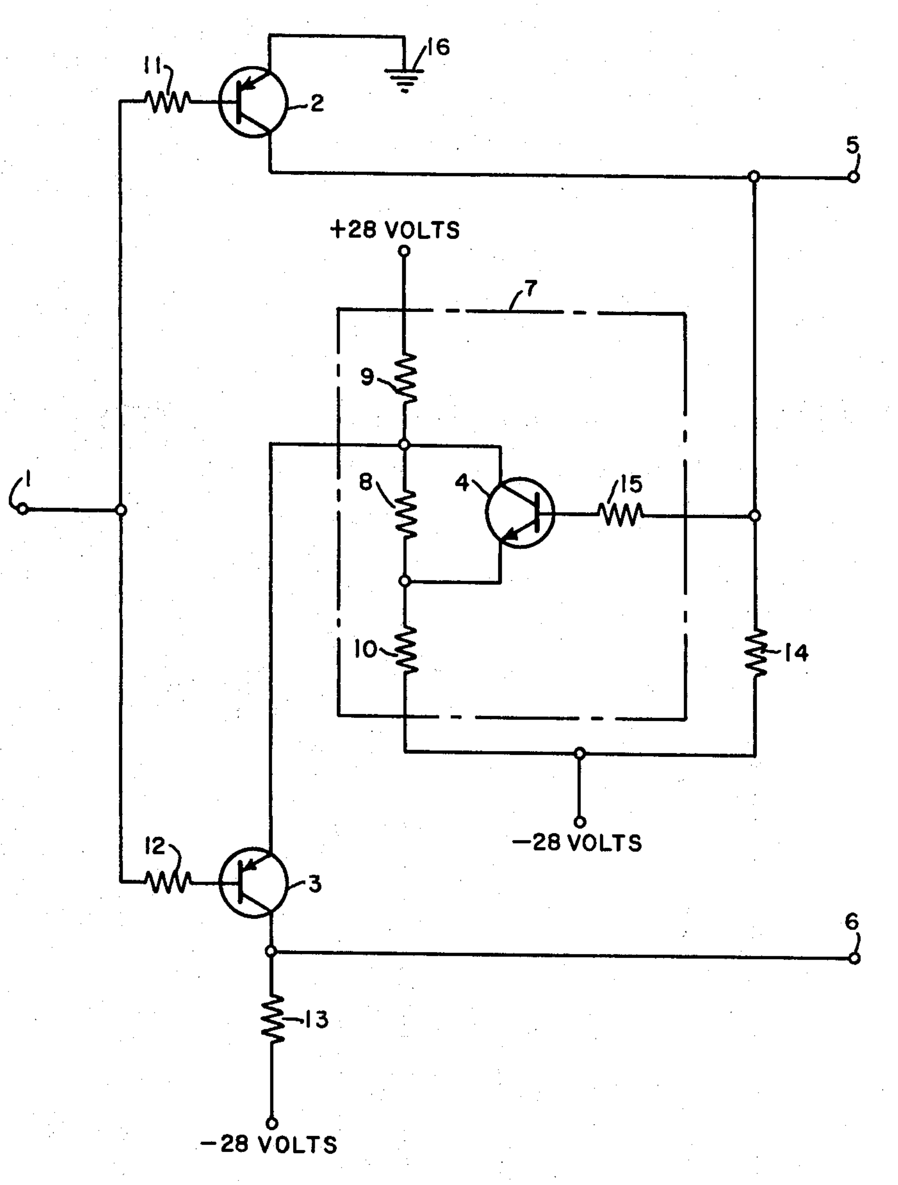
WITNESSES
Leon J. Taga
Paul Wenzel
INVENTOR
Roy M. Williams Jr
BY Ernest P. Klipfel
ATTORNEY United States Patent Office 3,371,337
Patented Feb. 27, 1968

3,371,337
HIGH SPEED ANALOG TO BINARY CONVERTER

Roy M. Williams, Jr., Laurel, Md., assignor to Westinghouse Electric Corporation, East Pittsburgh, Pa., a corporation of Pennsylvania Filed July 23, 1964, Ser. No. 384,685
3 Claims. (Cl. 340—347)

ABSTRACT OF THE DISCLOSURE

This invention comprises a one stage analog to binary converter, including two switching devices and a voltage divider network including a third switching device, each switching device having three terminals and being capable of two distinct conduction levels, an analog input means, and a most significant and a least significant bit output means; the first switching device being operable to supply at the most significant bit output, one of two distinct voltage levels in accordance with a comparison of the analog input with a fixed reference; the second switching device and voltage dividing network being operable to supply one of two distinct reference potentials in accordance with the output voltage of the first switching device; and the third switching device supplying one of two distinct voltage levels at the least significant bit output in response to a comparison of the analog input and the reference potential supplied by the second switching device and voltage divider.

This invention relates to data converters and in particular to analog to binary converters.

Data transmission systems often require high information densities, either in the form of much information per second, or much information per carrier channel. The latter is termed carrier compressed information and is the concern of this invention. Channel compressed information is usually multiplexed into fewer channels for transmission and separated back into many channels at the receiver. For example, two channels of binary bits might be compressed into one channel of quaternary information consisting of four analog voltage levels. The receiver in this system is an analog to binary converter and will detect and convert these four analog voltages back to their two channel binary form. This receiver represents an embodiment of the invention disclosed herein.

In analog to binary converters of the prior art, the four analog voltage levels at the input of the receiver are compared with four reference voltage levels by means of four diode bridges. Each bridge works in conjunction with a differential amplifier. The differential amplifier amplifies any voltage difference that exists between the analog voltage level and the corresponding reference voltage. Only one of the four reference voltages will match the analog input voltage at a given time. The four differential amplifier outputs are combined by appropriate logic circuitry into two channels of binary bits.

A considerable number of components are required for this prior art converter. There are four diodes in each bridge. The differential amplifiers in the simplified case need two transistors each, generally, however, three or more are necessary. One bridge and one amplifier are needed for each input voltage level, resulting in a total of 16 diodes and at least eight transistors. This total does not include the logic circuitry described above. Each component adds a little to the total size and expense of the converter. Each component subtracts a little from the total reliability and simplicity of the converter.

The response time of this circuit is the sum of the response times of each stage in the sequence: the diode bridge, the differential amplifier, and logic circuitry. The present trend toward high speed operation points out a definite limitation in this prior art converter.

It is therefore an object of this invention to provide an analog to binary converter employing a minimal of components.

A further object of this invention is to provide a smaller, less expensive, simpler, and more reliable analog to binary converter than heretofore possible.

A further object of this invention is to provide an analog to binary converter consisting of one operational stage.

A further object of this invention is to provide an analog to binary converter having a higher operational speed than heretofore possible.

Further objects, features, and advantages, of this invention will become apparent to those skilled in the art upon further study of these specifications.

Broadly the objects are obtained by means of a series of comprising or switching devices, one switching device for determining each bit in the binary output of the converter. This determination consists of comparing the analog input signal to a reference provided for each switching device. The result of each comparison determines the switching or operational state of each switching device. A binary output signal provided by each switching device, indicates the switching state therein. Two possible switching states exist for each device and therefore two binary output signals are possible, one representing the "0" and the other one representing the "1" in the binary numbering system.

The switching devices are arranged in order of the significance of the bit associated thereto, the most significant being first. Upon determination of the most significant bit, a reference for the second most significant switching device is established. The analog input signal is then compared to the reference for the second most significant bit to determine the second bit. The reference for the third most significant switching device is established by the first and second bit already determined. This process continues until all of the bits of the binary output are determined.

The novel features which are believed to be characteristic of the invention, both as to its organization and method of operation, together with further objects and advantages thereof, will be better understood from the following detailed description considered in connection with the accompanying drawing and chart, in which an embodiment of the invention is illustrated by way of example.

The drawing is a schematic diagram of an illustrative embodiment of the invention; and the chart shows the parameters involved in each operational mode of the circuit shown in the drawing.

Referring now to the drawing, an analog input signal applied to input channel 1 appears at the base of most significant switching transistor 2 and least significant switching transistor 3. In transistor 2 this analog input signal is compared to a reference voltage on the emitter. The emitter of transistor 2 is connected to a point of reference potential by ground 16. Depending on this comparison, transistor 2 will operate at either of two conducting levels. In this embodiment these operating or switching states are the "conducting" and "cut-off" conducting levels. The voltage at the collector of transistor 2 appears in the most significant binary output channel 5. This binary output signal has two distinct values corresponding to the two switching states of transistor 2 and representing the two digits in the binary numbering system.

In transistor 3 the analog signal is compared to the voltage on the emitter. As in transistor 2, the conducting level of transistor 3 is determined by a comparison between the base and the emitter voltages. The collector voltage of transistor 3 appears in the least significant bit output channel 6. In this instance however, the reference potential provided by the voltage dividing network 7 is not fixed put is dependent upon the switching state of transistor 2. Note the voltage at the collector of transistor 2 is applied to the base of reference transistor 4 through resistor 15 as well as to the most significant binary output channel 5. The reference potential applied to the emitter of transistor 3 is established at either of two values according to whether transistor 4 is at the "conducting" or "cut-off" conducting level due to the collector voltage of transistor 2. The resistance of the parallel combination of transistor 4 and resistor 8 controls the current in the voltage dividing network comprised of resistor 9, resistor 10 and the stated parallel combination. In short, the switching state of transistor 2 determines the current flow in the voltage dividing network, and therefore determines the reference potential provided to the emitter of transistor 3.

Various values of the analog input signal will cause four modes of operation in this circuit. These modes correspond to the four "conducting" and "cut-off" combinations of transistor 2 and transistor 3. The voltages appearing at the output channels 5 and 6 represent the bits of the binary numbers zero through three in a two bit binary system. The zero digit is represented by a distinct voltage within the range of −1.2 to +1.2 volts; the one digit, by a distinct voltage of −28 volts. The modes are referred to as 0, 1, 2 and 3 in accordance with the binary number produced by the mode.

transistor 4 remains conducting and the most significant bit output channel remains at approximately ground potential. Transistor 3, however, is cut-off because the base voltage (between −1.2 and 0 volts) is greater than the emitter voltage (−1.2 volts).

The voltage drop across resistor 13 is zero and therefore minus 28 volts, representing the one digit, appears at the least significant bit output channel 6.

The "2" operating mode occurs when the analog input signal is greater than 0 but less than +1.2. The "2" operating mode corresponds to the binary number 1, 0. The most significant bit output is −28 volts, and the least significant bit output is approximately ground. The positive analog input signal appearing on the base of transistor 2 is greater than ground potential on the emitter. Transistor 2 is cut-off. Minus 28 volts appears at the most significant bit output channel 5 and at the base of transistor 4. Transistor 4 is cut-off by the −28 volts and resistor 8 is no longer by-passed. The 56 volts of the voltage dividing network is divided among all three resistors, resistor 9, resistor 8, and resistor 10. The reference potential established for the emitter of transistor 3 is increased to +1.2 volts. The positive analog input signal (between 0 and +1.2 volts) applied to the base of transistor 3 is less than the emitter potential (+1.2 volts) therefore transistor 3 is conducting. The +1.2 reference potential appearing in the least significant bit output channel 6 represents the zero digit.

The "3" operating mode occurs when the analog input signal is greater than +1.2 volts. This operating mode corresponds to the binary number 1, 1. Both the most significant bit output and the least significant bit output

CHART

| Switching Mode | Binary Number Represented By Output | Analog Input Signal at Input Channel 1 | Conducting Levels of Transistors— | | |
|---|---|---|---|---|---|
| | | | 2 | 3 | 4 |
| 0 | 0 | Less than −1 2 v. | Conducting | Conducting | Conducting. |
| 1 | 1 | Between −1 2 v. and 0 v. | do | Cut-off | Do. |
| 2 | 2 | Between 0 v. and +1.2 v. | Cut-off | Conducting | Cut-off. |
| 3 | 3 | Greater than +1.2 v. | do | Cut-off | Do. |

Referring to the chart above, the "0" output mode of this embodiment occurs when the analog input signal applied to input channel 1 is less than −1.2 volts. The minus input voltage appears on the base of transistor 2 and transistor 3 through resistor 11 and resistor 12, respectively. This minus voltage is less than the ground potential on the emitter of transistor 2, therefore transistor 2 is conducting. Accordingly, the most significant bit output channel 5 and the base of transistor 4 is grounded. The ground potential appearing at the base of transistor 4 is greater than the negative reference voltage supplied to the emitter of transistor 4 from the voltage dividing network 7. Transistor 4 is conducting also. The conducting transistor 4 bypasses resistor 8 and the 56 volts across the voltage dividing network 7 is divided between resistor 9 and resistor 10. Under these conditions the reference potential established by the network 7 for transistor 3 is approximately −1.2 volts. The analog input signal on the base of transistor 3 being less than the reference potential on the emitter renders the transistor 3 conducting, thereby connecting the least significant bit output channel 6 to the emitter. The least significant bit output signal appearing on the least significant bit output channel 6 is therefore −1.2 volts and represents the zero digit in the binary numbering system. Thus, in the "0" mode both the most significant bit output appearing on the most significant bit output channel 5, and the least significant bit output appearing on the least significant bit output channel 6, are at approximately ground potential. These two ground potentials represent the two zeros in the binary number 0, 0.

The "1" operating mode of the circuit occurs when the analog input signal is greater than −1.2 volts but less than 0 volts. Transistor 2 remains conducting, therefore are at −28 volts. Transistor 2 remains cut-off, therefore, transistor 4 remains cut-off. The most significant bit output channel remains at −28 volts. Transistor 3 is cut-off because the base potential (+1.2 volts or greater) is greater than the emitter (+1.2 volts). Thus, −28 volts appears at the least significant bit output channel.

The above-described embodiment of the invention has been incorporated into a working model. The type and values for components used in this model are listed below:

| | |
|---|---|
| Transistor 2 | 2N1132 |
| Transistor 3 | 2N1132 |
| Transistor 4 | 2N697 |
| Resistor 8 | 750 |
| Resistor 9 | 3.32K |
| Resistor 10 | 3.01K |
| Resistor 11 | 10K |
| Resistor 12 | 10K |
| Resistor 13 | 27K |
| Resistor 14 | 27K |
| Resistor 15 | 2.7K |

The analog input signal described herein may have the form of digitized step voltages, or a continually varying voltage. The digitized input signal has voltage levels. Each voltage level establishes a different operating mode in the converter. This type of input is employed in the channel compressing information system described previously. The continuously varying input causes a particular operating mode only when the input voltage is within the range acceptable to that mode. As the input signal drifts out of that range another operating mode is established.

Thus, the number of components has been kept to a minimum by incorporating all of the electronic steps in a single operational stage. The decrease in the number of components has decreased the size and cost; and conversely has increased the simplicity and reliability. The elimination of all but one operating stage has decreased the size and cost; and conversely has increased the simplicity and reliability. The elimination of all but one operating stage has decreased the overall response time to the response time of that single stage.

Let it be understood that this invention is not to be limited to the simple 4 input voltage levels and 2 binary bit outputs as in the described embodiment. A more complex converter may be constructed by employing more switching devices. A 3 switching device converter provides 3 binary bit outputs and can distinguish 8 input voltage levels. This device requires 3 reference means. A 4 switching device converter requires 4 reference means, provides 4 binary bit outputs, and can distinguish 16 input voltage levels. In general: a converter employing M switching devices, requires M reference means, provides M binary bit outputs, and can distinguish 2 raised to the M power input voltage levels.

Although this invention has been described with respect to a particular embodiment thereof, it is not to be so limited as changes and modifications may be made which are within the full intended scope of this invention.

I claim:

1. In an analog to digital converter having an input channel for analog input signals, and having two binary output channels including a most significant bit channel and a least significant bit channel, both of said output channels having output signals consisting of a first and a second distinct voltage magnitude representing the two digits of the binary numbering system, the combination comprising; a first device, a third device, a voltage dividing network including in series the parallel combination of a second device and an impedance, each device having a first, a second, and a third terminal, each device capable of operating at a first and a second conducting level;

said first device having a point of reference voltage applied to said first terminal, having said input channel connected to said second terminal, having said most significant bit output channel connected to said third terminal, said first device responsive to said analog input signal such that when said analog input voltage is less than said point of reference voltage, said first conducting level is effected in said first device causing said first distinct voltage magnitude to appear in said most significant bit output channel, and when said analog input voltage is greater than said point of reference voltage said second conducting level is effected in said first device causing said second distinct voltage magnitude to appear in said most significant bit output channel;

said second device having said impedance connected across said first and said third terminal thereof and having said most significant bit output channel connected to said second terminal thereof, said second device responsive to said most significant bit output such that one of said distinct voltage magnitudes effects one of said conducting levels in said second device, and the other of said distinct voltage magnitudes effects the other of said conducting levels in said second device, said two conducting levels allowing two impedance values for said parallel combination, said two impedance values causing the establishment of a first and a second reference potential;

said third device having the established of the two reference potentials applied to said first terminal, having said analog input signal applied to said second terminal and having said least significant bit output channel connected to said third terminal, said third device responsive to said analog input signal and responsive to the established reference potential such that if said analog input signal is less than the established reference potential said first conducting level is effected in said third device causing said first distinct voltage magnitude to appear in said least significant bit output, and if said analog input signal is greater than said established reference potential said second conducting level is effected in said third device causing said second distinct voltage magnitude to appear in said least significant bit output channel;

whereby said analog to binary converter converts said analog input signal into a two bit binary output comprised of the signals on said two output channels.

2. An analog to binary converter comprising in combination:

a first switching means operable in a first and second state of operation and including first, second and third terminals;

a second switching means operable in a first and second state of operation and including first, second and third terminals;

each said switching means when in said first state of operation being operable to electrically connect respective first and third terminals;

first bias terminal means for application of a first bias potential to the third terminal of said first switching means;

second bias terminal means for application of a second bias potential to the third terminal of said second switching means;

means for connecting the first terminal of said first switching means to a first reference potential;

a second reference potential means operable to supply at least a second reference potential in response to one state of operation of said first switching means and a third reference potential in response to the other state of operation of said first switching means;

means for simultaneously applying an input signal to the second terminals of said first and second switching means;

said first switching means being responsive to said input signal and said first reference potential for being placed into one of its states of operation dependent upon the magnitude of said input signal;

said second switching means being responsive to said input signal and the reference potential supplied by said second reference potential means, for being placed into one of its states of operation, dependent upon the magnitude of said input signal; and first and second output means responsive, respectively, to the states of operation of said first and second switching means for providing first and second binary output signals.

3. Apparatus according to claim 2 wherein the second reference potential means includes:

a plurality of serially connected resistors;

a third switching means including first, second and third terminals, and connected in parallel with one of said resistors and operable to provide a low resistance path to effectively eliminate the resistor to which it is connected from the serial connection, when said first switching means is in a first state of operation;

said second switching means being placed into one of its states of operation in response to a predetermined state of operation of the first switching means.

References Cited

UNITED STATES PATENTS

| | | | |
|---|---|---|---|
| 3,261,012 | 7/1966 | Bentley | 340—347 |
| 3,315,251 | 4/1967 | Kaneko | 340—347 |
| 3,156,913 | 11/1964 | Crocker et al. | 340—347 |
| 3,247,507 | 3/1966 | Moses | 340—347 |

MAYNARD R. WILBUR, *Primary Examiner.*

DARYL W. COOK, *Examiner.*

A. L. NEWMAN, G. R. EDWARDS, *Assistant Examiners.*